(12) United States Patent
Oguri

(10) Patent No.: US 6,194,920 B1
(45) Date of Patent: Feb. 27, 2001

(54) SEMICONDUCTOR CIRCUIT

(75) Inventor: Takashi Oguri, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/151,773

(22) Filed: Sep. 11, 1998

(30) Foreign Application Priority Data

Sep. 11, 1997 (JP) .................................................. 9-247061

(51) Int. Cl.[7] ...................................................... H03F 3/45
(52) U.S. Cl. ................................ 327/65; 327/89; 327/563
(58) Field of Search ............................ 327/52–57, 65–68, 327/70, 77–82, 85, 88, 89, 112, 391; 326/83

(56) References Cited

U.S. PATENT DOCUMENTS 5,563,835 * 10/1996 Oldham .................................. 327/52
5,751,186 * 5/1998 Nakao ..................................... 327/65

FOREIGN PATENT DOCUMENTS

| 61-22495 | 1/1986 | (JP) . |
| 1-151309 | 6/1989 | (JP) . |
| 5-48430 | 2/1993 | (JP) . |
| 5-75437 | 3/1993 | (JP) . |
| 6-152275 | 5/1994 | (JP) . |

* cited by examiner

*Primary Examiner*—Tuan T. Lam
(74) *Attorney, Agent, or Firm*—Foley & Lardner

(57) ABSTRACT

The invention provides a semiconductor circuit which can accept signals of various levels and operate at a high speed with low power dissipation. The semiconductor circuit includes a PMOS differential circuit having two inputs one of which is connected to a first input terminal and the other of which is connected to a second input terminal, an NMOS differential circuit having two inputs one of which is connected to the first input terminal and the other of which is connected to the second input terminal, and an output circuit operable in response to differential outputs of the PMOS differential circuit and the NMOS differential circuit for preventing, when a current path is formed between an output terminal and a power supply terminal, formation of a current path between a ground terminal and the output terminal, but preventing, when a current path is formed between the output terminal and the ground terminal, formation of a current path between the power supply terminal and the output terminal.

11 Claims, 8 Drawing Sheets

SEMICONDUCTOR CIRCUIT

BACKGROUND OF THE INVENTION

1. Field of the Invention

The present invention relates to a semiconductor circuit, and more particularly to a semiconductor circuit which is used as an input buffer for interconnection between large scale integration circuits.

2. Description of the Related Art

As a semiconductor circuit of the type mentioned, a differential amplification circuit is conventionally used to achieve a high speed interface operation.

An NMOS differential amplification circuit which employs an NMOS transistor amplifies, if a signal of a false emitter coupled logic (ECL) level is applied to an input terminal, the signal and outputs a signal of a complementary metal oxide semiconductor (CMOS) level (hereinafter referred to as first prior art).

The circuit of the first prior art described above exhibits a small delay when the level of the input signal is proximate to a power supply voltage like a signal of the false ECL level. However, the first prior art circuit is disadvantageous in that, when the level of the input signal is proximate to a reference voltage like a gunning transfer logic (GTL) level, it exhibits a large delay time because the operating current is low.

Meanwhile, a PMOS differential amplification circuit which employs a PMOS transistor receives a signal of the GTL level at an input terminal thereof and outputs a signal of the CMOS level (hereinafter referred to as second prior art).

The circuit of the second prior art just described exhibits a small delay time when the level of the input signal is proximate to the GTL level. However, the second prior art circuit is disadvantageous in that it exhibits a large delay time when the level of the input signal is proximate to a power supply voltage like a signal of the false ECL level.

A further semiconductor circuit of the type described is disclosed in Japanese Patent Laid-Open Application No. Heisei 5-48430 and is shown in FIG. 7.

Referring to FIG. 7, the semiconductor circuit includes a PMOS differential circuit 1100 and an NMOS differential circuit 1200 whose output terminals are connected to an output line 1140. A pair of inverters 1150 and 1160 are connected in a cascade connection to the output line 1140 so that an output signal may be obtained through the inverters 1150 and 1160 (hereinafter referred to as third prior art).

Referring also to FIG. 8, with the semiconductor circuit of the third prior art, since the output terminal of the PMOS differential circuit 1100 and the output terminal of the NMOS differential circuit 1200 are connected to the output line 1140, even if a signal which oscillates between the ground level GND and a power supply voltage is inputted to each of the input terminals, the signal outputted from the output line 1140 does not exhibit oscillations between the ground level and the power supply voltage. Consequently, the semiconductor circuit is disadvantageous in that, in the inverter 1150 connected to the output line 1140, through-current flows from a power supply terminal to the ground and increases the power dissipation as much.

Further, since also the output signal of the inverter 1150 does not oscillate between the ground level and the power supply voltage, it must be inputted to the additional inverter 1160. In this manner, the third prior art circuit is disadvantageous in that, in order to obtain an output signal which oscillates between the ground level and the power supply voltage, an additional inverter must be provided and this has a bad influence on high speed operation.

SUMMARY OF THE INVENTION

It is an object of the present invention to provide a semiconductor circuit which can accept signals of various levels and operate at a high speed with low power dissipation.

It is another object of the present invention to provide a semiconductor circuit which outputs a signal which oscillates between the ground level and a power supply voltage when a signal which oscillates between the ground level and the power supply voltage like a CMOS level signal is inputted.

It is a further object of the present invention to provide a semiconductor circuit which can correct a displacement of a CMOS level signal inputted thereto from a threshold level.

In order to attain the object described above, according to the present invention, there is provided a semiconductor circuit, comprising first and second input terminals, a PMOS differential circuit having two inputs one of which is connected to the first input terminal and the other of which is connected to the second input terminal for outputting a first differential output, an NMOS differential circuit having two inputs one of which is connected to the first input terminal and the other of which is connected to the second input terminal for outputting a second differential output, first and second power supply terminals, an output terminal, and an output circuit operable in response to the first and second differential outputs for preventing, when a current path is formed between the output terminal and the first power supply terminal, formation of a current path between the second power supply terminal and the output terminal, but preventing, when a current path is formed between the output terminal and the second power supply terminal, formation of a current path between the first power supply terminal and the output terminal.

In the semiconductor circuit, the output circuit is provided which operates in response to differential outputs of the PMOS differential circuit and the NMOS differential circuit such that, when a current path is formed between the output terminal and the first power supply terminal, it prevents formation of a current path between the second power supply terminal and the output terminal, but, when a current path is formed between the output terminal and the second power supply terminal, it prevents formation of a current path between the first power supply terminal and the output terminal. Consequently, when a CMOS level signal which oscillates between potentials of the first and second power supply terminals is inputted, the semiconductor circuit can output a CMOS level signal which oscillates between the potentials of the first and second power supply terminals. Consequently, the semiconductor circuit can accept signals of various levels and operate at a high speed with low power dissipation.

The output circuit may include a first PMOS transistor having a control terminal to which the first differential output of the PMOS differential circuit is inputted, and a source connected to the first power supply terminal, a second PMOS transistor having a control terminal to which the second differential output of the NMOS differential circuit is inputted, a source connected to a drain of the first PMOS transistor, and a drain connected to the output terminal, a first NMOS transistor having a control terminal to which the first differential output of the PMOS differential circuit is inputted, and a drain connected to the output terminal and the drain of the second PMOS transistor, and a second NMOS transistor having a control terminal to which the second differential output of the NMOS differential circuit is inputted, a drain connected to a source of the first NMOS transistor, and a source connected to the second power supply terminal.

As an alternative, the output circuit may include a first PMOS transistor having a control terminal to which the second differential output of the NMOS differential circuit is inputted, and a source connected to the first power supply terminal, a second PMOS transistor having a control terminal to which the first differential output of the PMOS differential circuit is inputted, a source connected to a drain of the first PMOS transistor, and a drain connected to the output terminal, a first NMOS transistor having a control terminal to which the first differential output of the PMOS differential circuit is inputted, and a drain connected to the output terminal and the drain of the second PNOS transistor, and a second NMOS transistor having a control terminal to which the second differential output of the NMOS differential circuit is inputted, a drain connected to a source of the first NMOS transistor, and a source connected to the second power supply terminal.

As another alternative, the output circuit may include a first PMOS transistor having a control terminal to which the first differential output of the PMOS differential circuit is inputted, and a source connected to the first power supply terminal, a second PMOS transistor having a control terminal to which the second differential output of the NMOS differential circuit is inputted, a source connected to a drain of the first PMOS transistor, and a drain connected to the output terminal, a first NMOS transistor having a control terminal to which the second differential output of the NMOS differential circuit is inputted, and a drain connected to the output terminal and the drain of the second PMOS transistor, and a second NMOS transistor having a control terminal to which the first differential output of the PMOS differential circuit is inputted, a drain connected to a source of the first NMOS transistor, and a source connected to the second power supply terminal.

As a further alternative, the output circuit may include a first PMOS transistor having a control terminal to which the second differential output of the NMOS differential circuit is inputted, and a source connected to the first power supply terminal, a second PMOS transistor having a control terminal to which the first differential output of the PMOS differential circuit is inputted, a source connected to a drain of the first PMOS transistor, and a drain connected to the output terminal, a first NMOS transistor having a control terminal to which the second differential output of the NMOS differential circuit is inputted, and a drain connected to the output terminal and the drain of the second PMOS transistor, and a second NMOS transistor having a control terminal to which the first differential output of the PMOS differential circuit is inputted, a drain connected to a source of the first NMOS transistor, and a source connected to the second power supply terminal.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Figure 1:
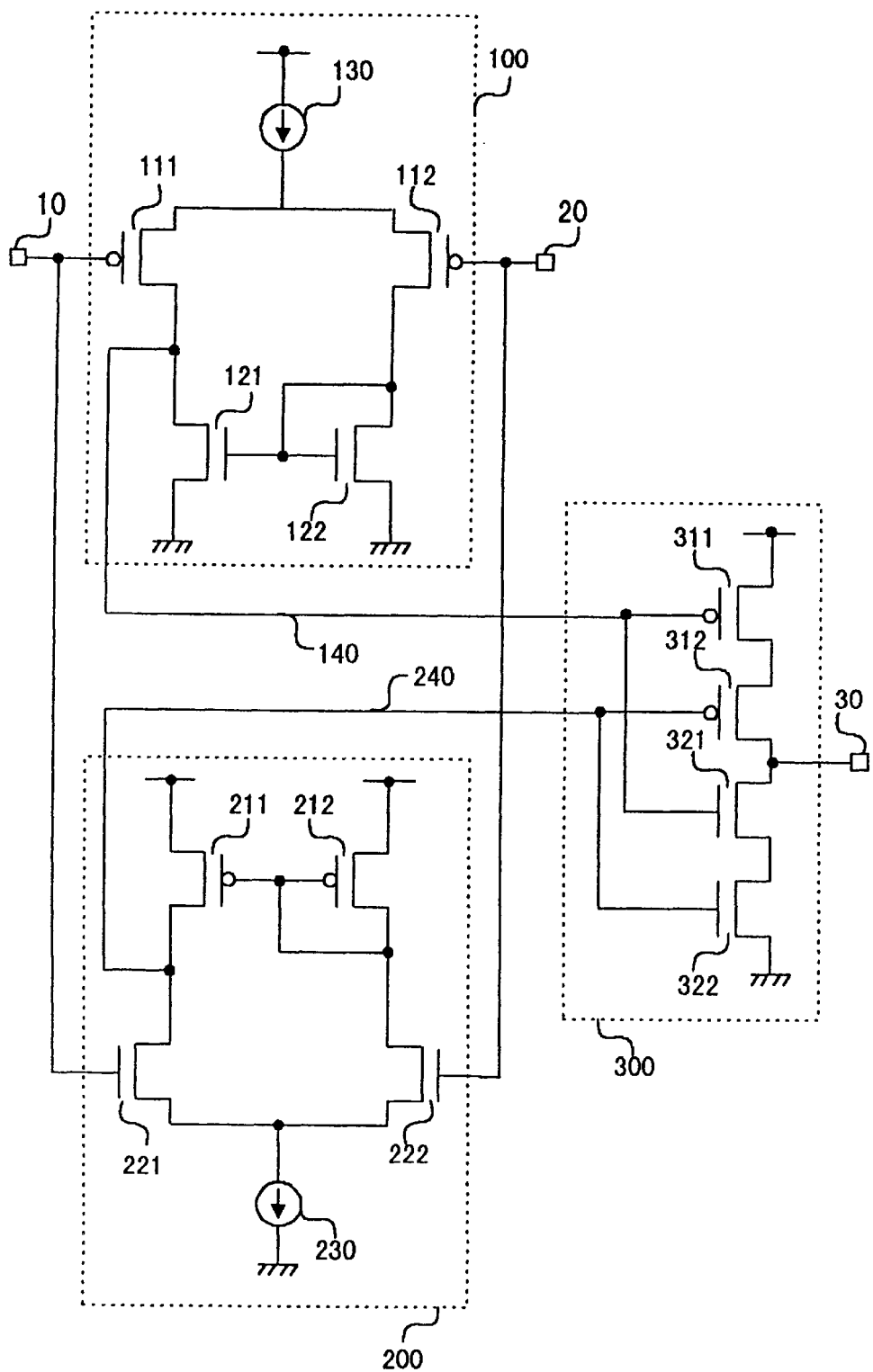
FIG. 1 is a circuit diagram of a semiconductor circuit to which the present invention is applied.

Referring first to FIG. 1, there is shown a semiconductor circuit to which the present invention is applied. The semiconductor circuit shown includes a pair of input terminals 10 and 20, an output terminal 30, a PMOS differential circuit 100, an NMOS differential circuit 200 and a buffer circuit 300.

The PMOS differential circuit 100 includes a PMOS transistor 111, another PMOS transistor 112, an NMOS transistor 121, another NMOS transistor 122, a current source 130 and an output line 140.

The PMOS transistor 111 is connected at the gate thereof to the input terminal 10, at the source thereof to the current source 130 and at the drain thereof to the drain of the NMOS transistor 121.

The PMOS transistor 112 is connected at the gate thereof to the input terminal 20, at the source thereof to the current source 130 and at the drain thereof to the drain of the NMOS transistor 122.

The NMOS transistor 121 is connected at the drain thereof to the drain of the PMOS transistor 111, and at the source thereof to a reference potential. In the following description of the semiconductor circuit of the present embodiment, the reference potential is the ground potential GND.

The NMOS transistor 122 is connected at the gate thereof to the gate of the NMOS transistor 121, at the drain thereof to the gate of the NMOS transistor 121 and the drain of the PMOS transistor 112, and at the source thereof to the reference potential GND.

The current source 130 is connected at a terminal thereof to a terminal of a power supply $V_{DD}$ and at the other terminal thereof to the source of the PMOS transistor 111 and the source of the PMOS transistor 112. In the following description of the semiconductor circuit of the present embodiment, the power supply voltage $V_{DD}$ is 3.3 volts.

The output line 140 is connected to a junction between the drain of the PMOS transistor 111 and the drain of the NMOS transistor 121 and outputs a differential output of the PMOS differential circuit 100.

The NMOS differential circuit 200 includes a PMOS transistor 211, another PMOS transistor 212, an NMOS transistor 221, another NMOS transistor 222, a current source 230 and an output line 240.

The PMOS transistor 211 is connected at the source thereof to a terminal of the power supply $V_{DD}$, and at the drain thereof to the drain of the NMOS transistor 221.

The PMOS transistor 212 is connected at the source thereof to a terminal of the power supply $V_{DD}$, at the source thereof to the gate of the PMOS transistor 211, and at the drain thereof to the gate of the PMOS transistor 211 and the drain of the NMOS transistor 222.

The NMOS transistor 221 is connected at the gate thereof to the input terminal 10, at the drain thereof to the drain of the PMOS transistor 211, and at the source thereof to the current source 230.

The NMOS transistor 222 is connected at the gate thereof to the input terminal 20, at the drain thereof to the drain of the PMOS transistor 212, and at the source thereof to the current source 230.

The current source 230 is connected at a terminal thereof to a terminal of the ground potential GND and at the other terminal thereof to the source of the NMOS transistor 221 and the source of the NDOS transistor 222.

The output line 240 is connected to a junction between the drain of the PMOS transistor 211 and the drain of the NMOS transistor 221 and outputs a differential output of the NMOS differential circuit 200.

The buffer circuit 300 includes a PMOS transistor 311, another PMOS transistor 312, an NMOS transistor 321 and another NMOS transistor 322.

The PMOS transistor 311 is connected at the gate thereof to the output line 140 of the PMOS differential circuit 100 and at the source thereof to a terminal of the power supply $V_{DD}$.

The PMOS transistor 312 is connected at the gate thereof to the output line 240 of the NMOS differential circuit 200, at the source thereof to the drain of the PMOS transistor 311 and at the drain thereof to the output terminal 30.

The NMOS transistor 321 is connected at the gate thereof to the output line 140 of the PMOS differential circuit 100 and at the drain thereof to the output terminal 30 and the drain of the PMOS transistor 312.

The NMOS transistor 322 is connected at the gate thereof to the output line 240 of the NMOS differential circuit 200, at the drain thereof to the source of the NMOS transistor 321 and at the source thereof to a terminal of the ground potential GND.

Now, operation of the semiconductor circuit described above is described.

When a signal having a voltage proximate to the voltage of the power supply $V_{DD}$ like a false ECL level signal is inputted to the input terminal 10, the NMOS differential circuit 200 complements operation of the PMOS differential circuit 100.

On the other hand, when another signal having a voltage proximate to the reference potential GND like a GTL level signal is inputted to the input terminal 10, the PMOS differential circuit 100 complements operation of the NMOS differential circuit 200.

When a signal which oscillates between the voltage of the power supply $V_{DD}$ and the reference or ground potential GND like a CMOS level signal is inputted to the input terminal 10, a comparison voltage is in almost all cases around one half the voltage of the power supply $V_{DD}$, and the semiconductor circuit which is used as an input buffer is required to have characteristics of both of the PMOS differential circuit 100 and the NMOS differential circuit 200. In the semiconductor circuit of the present embodiment, the comparison potential is 1.65 volts.

Figure 2:
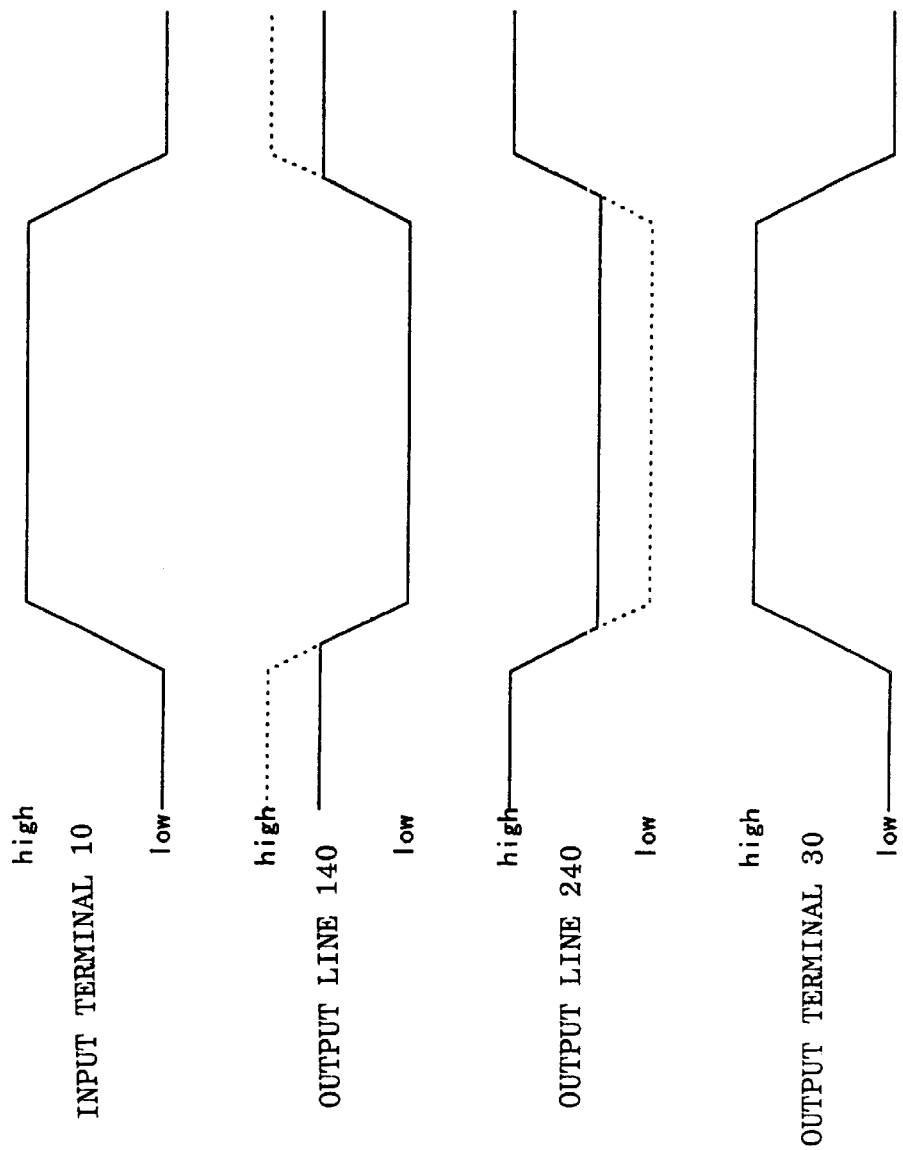
FIG. 2 is a waveform diagram illustrating operation of the semiconductor circuit of FIG. 1.

Referring to FIGS. 1 and 2, if the input signal rises from the ground potential GND level (hereinafter referred to as low level) to a voltage (3.3 volts) level (hereinafter referred to as high level) of the power supply $V_{DD}$, then the differential output of the PMOS differential circuit 100 which is outputted from the output line 140 drops to the low level. The differential output of the NMOS differential circuit 200 which is outputted from the output line 240 drops from the high level to a value between the high level and the low level. Consequently, the PMOS transistors 311 and 312 of the buffer circuit 300 are turned into an on-state, and a current path is formed between the terminal of the power supply $V_{DD}$ and the output terminal 30. The NMOS transistor 321 of the buffer circuit 300 is turned into an off-state since the low level signal from the output line 140 is inputted to the gate of the NMOS transistor 321. Consequently, no current path is formed between the terminal of the power supply $V_{DD}$ and the output terminal 30, and no through-current flows. As a result, a signal of the high level is outputted from the output terminal 30.

If the input signal applied to the input terminal 10 drops from the high level to the low level, then the differential output of the PMOS differential circuit 100 which is outputted from the output line 140 rises from the low level to a value between the low level and the high level. The differential output of the NMOS differential circuit 200 which is outputted from the output line 240 rises from the value between the low level and the high level to the high level. Consequently, the NMOS transistors 321 and 322 of the buffer circuit 300 are turned into an on-state, and a current path is formed between the ground potential GND terminal and the output terminal 30. The PMOS transistor 312 of the buffer circuit 300 is turned into an off-state since the high level from the output line 240 is inputted to the gate of the PMOS transistor 312. Consequently, no current path is formed between the terminal of the power supply $V_{DD}$ and the output terminal 30, and no through-current flows. As a result a signal of the low level is outputted from the output terminal 30.

In this manner, in the semiconductor circuit of the present embodiment, since the buffer circuit 300 is provided which operates in response to the differential outputs of the PMOS differential circuit 100 and the NMOS differential circuit 200 such that, when a current path is formed between the output terminal 30 and the terminal of the power supply $V_{DD}$, it prevents formation of a current path between the terminal of the ground potential GND and the output terminal 30, but, when a current path is formed between the output terminal 30 and the terminal of the ground potential GND, it prevents formation of a current path between the terminal of the power supply $V_{DD}$ and the output terminal 30. When a CMOS level signal which oscillates between the ground level GND and the power supply potential $V_{DD}$ is inputted, the semiconductor circuit can output a CMOS level signal which oscillates between the ground potential GND and the power supply potential $V_{DD}$.

Figure 3:
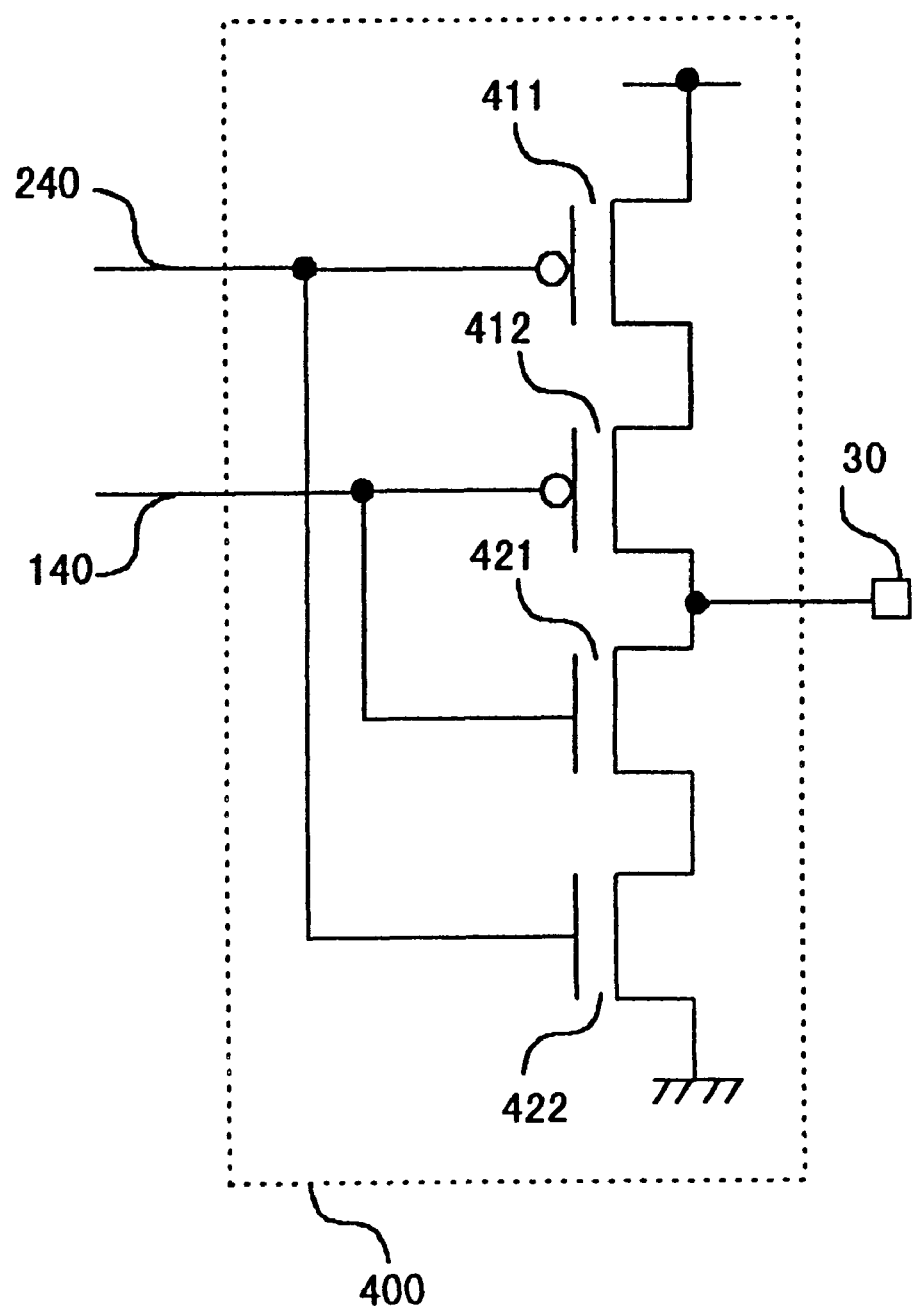
FIG. 3 is a circuit diagram of an alternative buffer circuit which can be employed in the semiconductor circuit of FIG. 1.

Referring now to FIG. 3, there is shown an alternative buffer circuit which can be employed in place of the buffer circuit 300 in the semiconductor circuit described hereinabove with reference to FIG. 1.

The alternative buffer circuit is generally denoted at 400 and includes aPMOS transistor 411, another PMOS transistor 412, an NMOS transistor 421 and another NMOS transistor 422.

Referring also to FIG. 1, the PMOS transistor 411 is connected at the gate thereof to the output line 240 of the NMOS differential circuit 200 and at the source thereof to a terminal of the power supply $V_{DD}$.

The PMOS transistor 412 is connected at the gate thereof to the output line 140 of the PMOS differential circuit 100, at the source thereof to the drain of the PMOS transistor 411 and at the drain thereof to the output terminal 30.

The NMOS transistor 421 is connected at the gate thereof to the output line 140 of the PMOS differential circuit 100 and at the drain thereof to the output terminal 30 and the drain of the PMOS transistor 412.

The NMOS transistor 422 is connected at the gate thereof to the output line 240 of the NMOS differential circuit 200, at the drain thereof to the source of the NMOS transistor 421 and at the source thereof to a terminal of the ground potential GND.

Figure 4:
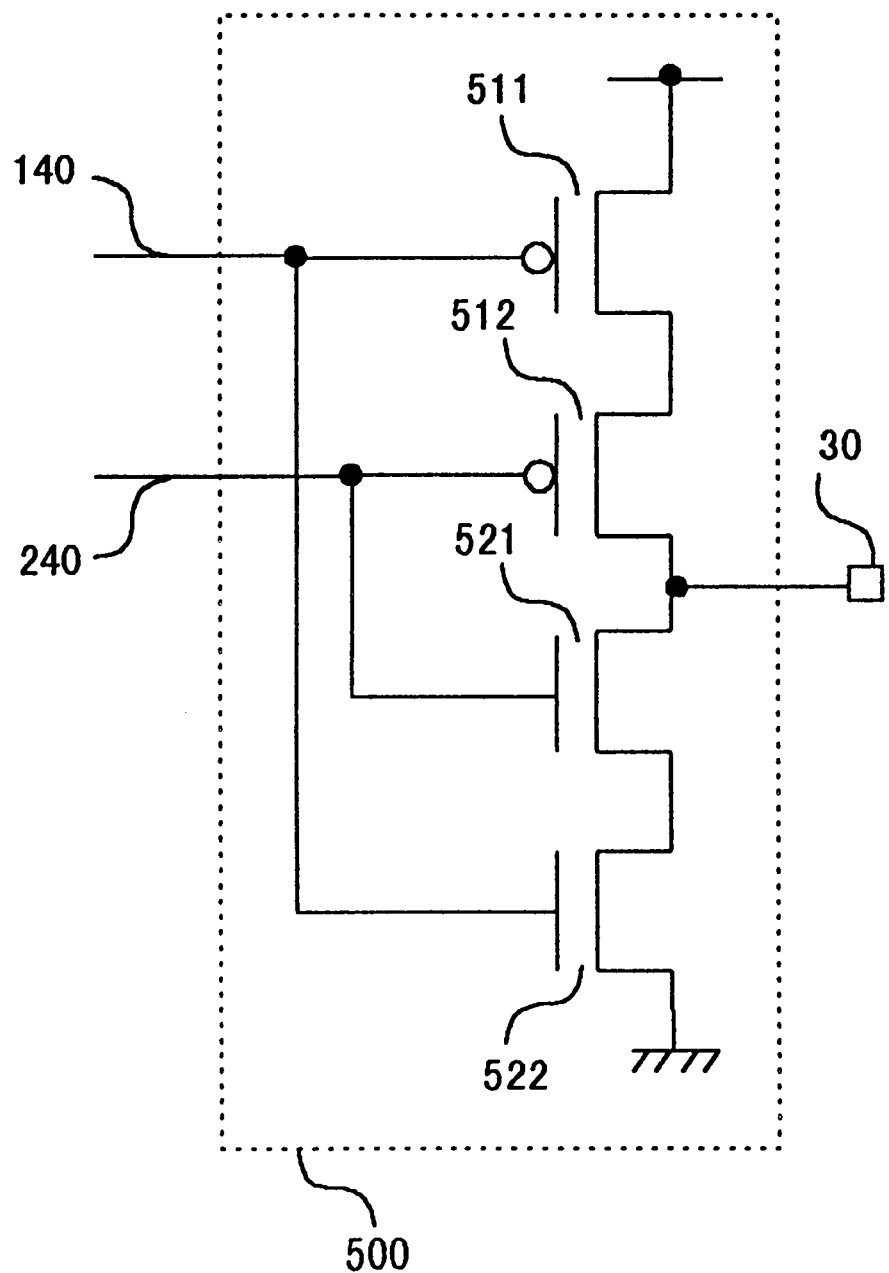
FIG. 4 is a circuit diagram of another alternative buffer circuit which can be employed in the semiconductor circuit of FIG. 1.

Referring now to FIG. 4, there is shown another alternative buffer circuit which can be employed in the semiconductor circuit 300 described hereinabove with reference to FIG. 1.

The buffer circuit shown is generally denoted at 500 and includes a PMOS transistor 511, another PMOS transistor 512, an NMOS transistor 521 and another NMOS transistor 522.

Referring also to FIG. 1, the PMOS transistor 511 is connected at the gate thereof to the output line 140 of the PMOS differential circuit 100 and at the source thereof to a terminal of the power supply $V_{DD}$.

The PMOS transistor 512 is connected at the gate thereof to the output line 240 of the NMOS differential circuit 200, at the source thereof to the drain of the PMOS transistor 511 and at the drain thereof to the output terminal 30.

The NMOS transistor 521 is connected at the gate thereof to the output line 240 of the NMOS differential circuit 200 and at the drain thereof to the output terminal 30 and the drain of the PNOS transistor 512.

The NMOS transistor 522 is connected at the gate thereof to the output line 140 of the PMOS differential circuit 100, at the drain thereof to the source of the NMOS transistor 521 and at the source thereof to a terminal of the ground potential GND.

Figure 5:
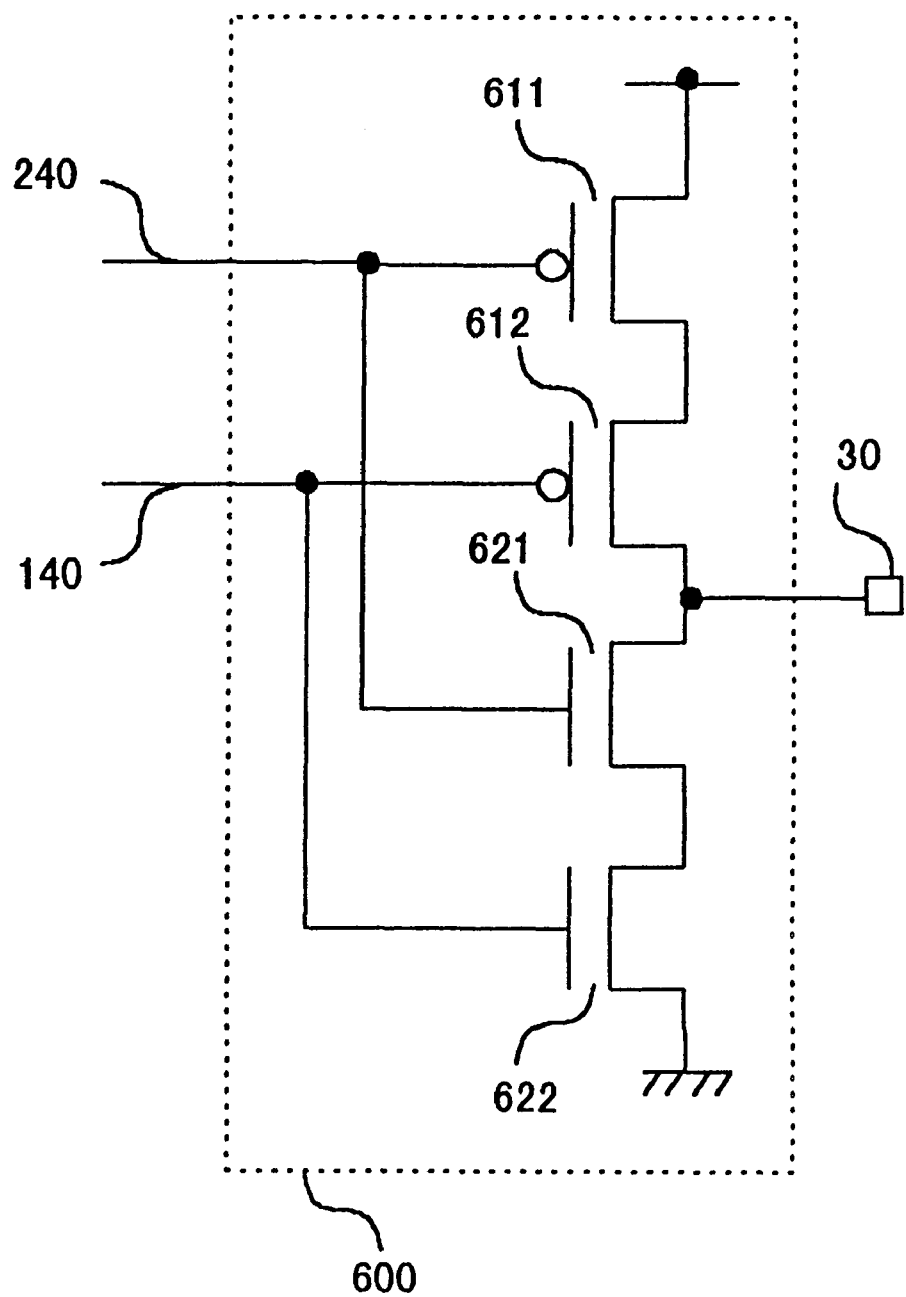
FIG. 5 is a circuit diagram of a further alternative buffer circuit which can be employed in the semiconductor circuit of FIG. 1.

Referring now to FIG. 5, there is shown a further alternative buffer circuit which can be employed in the semiconductor circuit described hereinabove with reference to FIG. 1.

The buffer circuit shown is generally denoted at 600 alnd includes a PMOS transistor 611, another PMOS transistor 612, an NMOS transistor 621 and another NMOS transistor 622.

Referring also to FIG. 1, the PMOS transistor 611 is connected at the gate thereof to the output line 240 of the NMOS differential circuit 200 and at the source thereof to a terminal of the power supply $V_{DD}$.

The PMOS transistor 612 is connected at the gate thereof to the output line 140 of the PMOS differential circuit 100, at the source thereof to the drain of the PMOS transistor 611 and at the drain thereof to the output terminal 30.

The NMOS transistor 621 is connected at the gate thereof to the output line 240 of the NMOS differential circuit 200, and at the drain thereof to the output terminal 30 and the drain of the PMOS transistor 612.

The NMOS transistor 622 is connected at the gate thereof to the output line 140 of the PMOS differential circuit 100, at the drain thereof to the source of the NMOS transistor 621, and at the source thereof to a terminal of the ground potential GND.

Figure 6A:
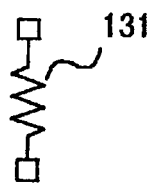
FIGS. 6(a), 6(b) and 6(c) are circuit diagrams showing current sources which can be employed in the semiconductor circuit of FIG. 1.
Figure 6B:
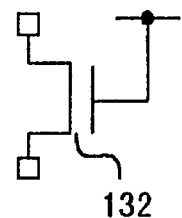
Figure 6C:
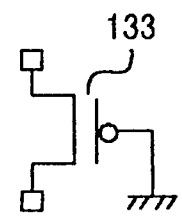
Figure 7:
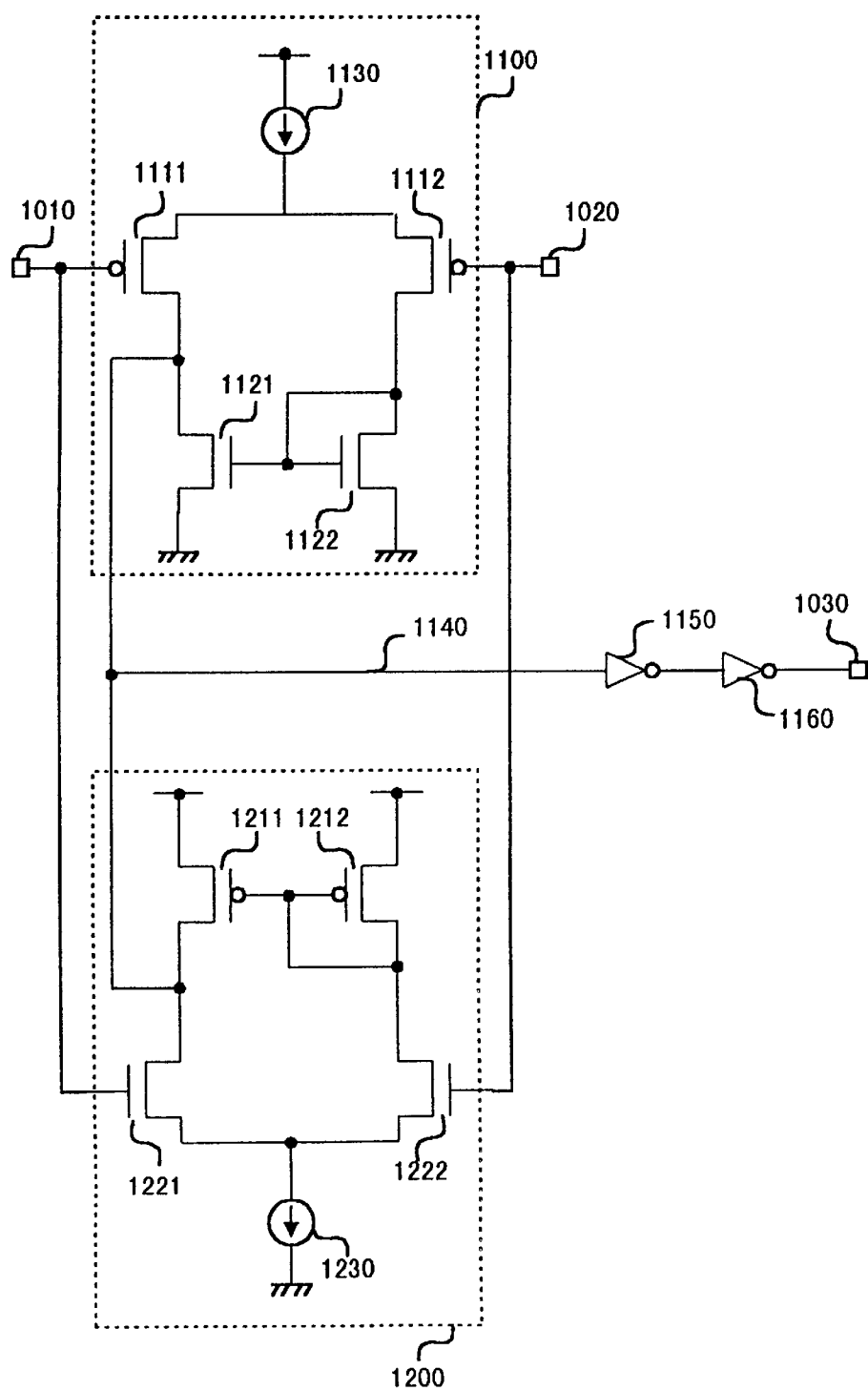
FIG. 7 is a circuit diagram showing a conventional semiconductor circuit.
Figure 8:
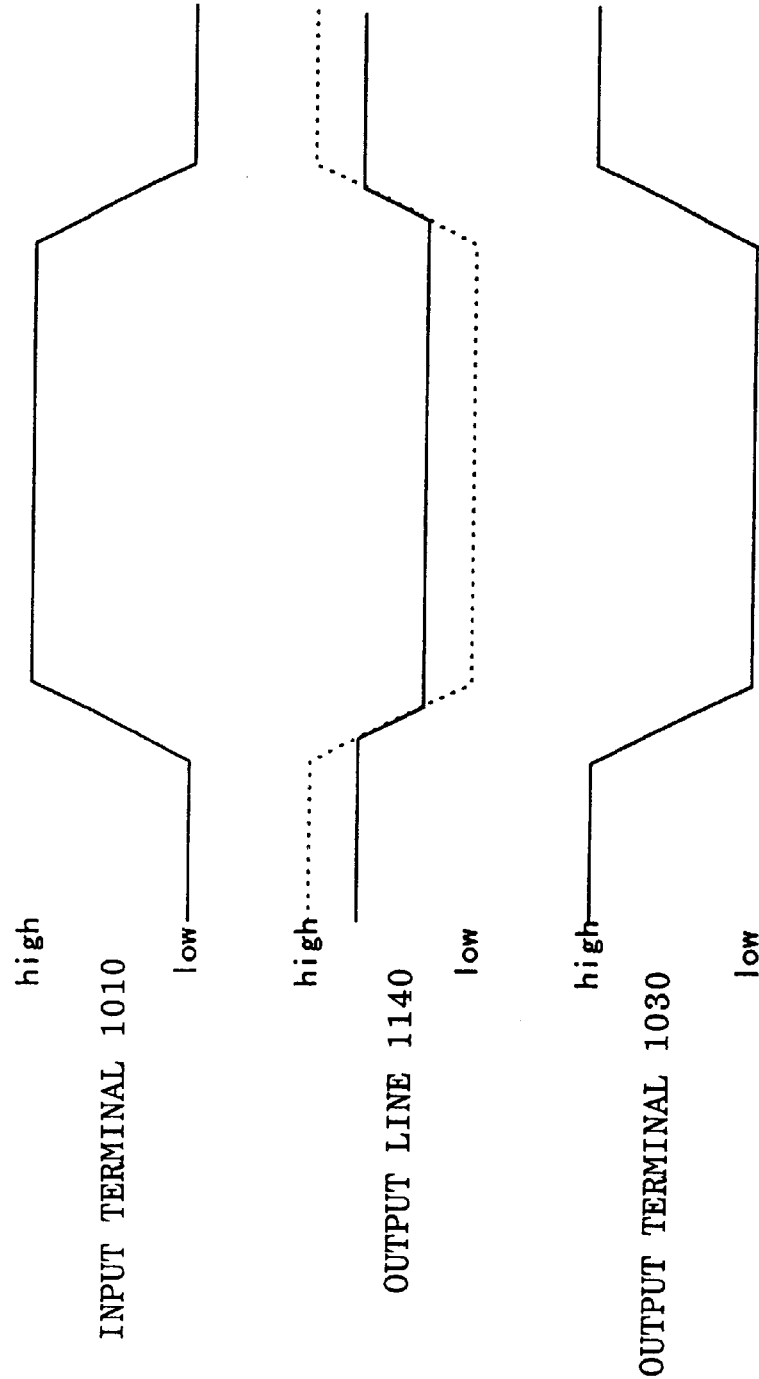
FIG. 8 is a waveform diagram illustrating operation of the semiconductor circuit of FIG. 7.

FIGS. 6(a) to 6(c) show different forms of a current source which can be used for the current sources 130 and 230.

FIG. 6(a) shows a current source 131 which is composed of a resistance element. Where the current source is composed of a resistance element, it is simple and small in circuit construction. However, it is liable to be influenced by a variation of the power supply.

FIG. 6(b) shows another current source 132 which is composed of an NMOS transistor while FIG. 6(c) shows a further current source 133 which is composed of a PMOS transistor. Where the current source is composed of an NMOS transistor or a PMOS transistor, it can be manufactured more readily than where it is composed of a resistance element.

While preferred embodiments of the present invention have been described using specific terms, such description is for illustrative purposes only, and it is to be understood that changes and variations may be made without departing from the spirit or scope of the following claims.

What is claimed is:

1. A semiconductor circuit, comprising:
   first and second input terminals;
   a PMOS differential circuit having two inputs, one of which is connected to said first input terminal and the other of which is connected to said second input terminal for outputting a first differential output;
   an NMOS differential circuit having two inputs, one of which is connected to said first input terminal and the other of which is connected to said second input terminal for outputting a second differential output;
   first and second power supply terminals;
   an output terminal; and
   an output circuit operable in response to the first and second differential outputs for (i) preventing, when a first current path is formed between said output terminal and said first power supply terminal, formation of a second current path between said second power supply terminal and said output terminal, but preventing, when the second current path is formed between said output terminal and said second power supply terminal, formation of the first current path between said first power supply terminal and said output terminal, when the input terminals are at high and low levels, and (ii) preventing both the first and second current paths from being formed when the input terminals are at an intermediate level.

2. A semiconductor circuit as claimed in claim 1, wherein said output circuit includes:
   a first PMOS transistor having a control terminal to which the first differential output of said PMOS differential circuit is inputted, and a source connected to said first power supply terminal;
   a second PMOS transistor having a control terminal to which the second differential output of said NMOS differential circuit is inputted, a source connected to a drain of said first PMOS transistor, and a drain connected to said output terminal;
   a first NMOS transistor having a control terminal to which the first differential output of said PMOS differential circuit is inputted, and a drain connected to said output terminal and the drain of said second PMOS transistor; and
   a second NMOS transistor having a control terminal to which the second differential output of said NMOS differential circuit is inputted, a drain connected to a source of said first NMOS transistor, and a source connected to said second power supply terminal.

3. A semiconductor circuit as claimed in claim 1, wherein said output circuit includes:

a first PMOS transistor having a control terminal to which the second differential output of said NMOS differential circuit is inputted, and a source connected to said first power supply terminal;

a second PMOS transistor having a control terminal to which the first differential output of said PMOS differential circuit is inputted, a source connected to a drain of said first PMOS transistor, and a drain connected to said output terminal;

a first NMOS transistor having a control terminal to which the first differential output of said PMOS differential circuit is inputted, and a drain connected to said output terminal and the drain of said second PMOS transistor; and a second NMOS transistor having a control terminal to which the second differential output of said NMOS differential circuit is inputted, a drain connected to a source of said first NMOS transistor, and a source connected to said second power supply terminal.

4. A semiconductor circuit as claimed in claim 1, wherein said output circuit includes:

a first PMOS transistor having a control terminal to which the first differential output of said PMOS differential circuit is inputted, and a source connected to said first power supply terminal;

a second PMOS transistor having a control terminal to which the second differential output of said NMOS differential circuit is inputted, a source connected to a drain of said first PMOS transistor, and a drain connected to said output terminal;

a first NMOS transistor having a control terminal to which the second differential output of said NMOS differential circuit is inputted, and a drain connected to said output terminal and the drain of said second PMOS transistor; and a second NMOS transistor having a control terminal to which the first differential output of said PMOS differential circuit is inputted, a drain connected to a source of said first NMOS transistor, and a source connected to said second power supply terminal.

5. A semiconductor circuit as claimed in claim 1, wherein said output circuit includes:

a first PMOS transistor having a control terminal to which the second differential output of said NMOS differential circuit is inputted, and a source connected to said first power supply terminal;

a second PMOS transistor having a control terminal to which the first differential output of said PMOS differential circuit is inputted, a source connected to a drain of said first PMOS transistor, and a drain connected to said output terminal;

a first NMOS transistor having a control terminal to which the second differential output of said NMOS differential circuit is inputted, and a drain connected to said output terminal and the drain of said second PMOS transistor; and a second NMOS transistor having a control terminal to which the first differential output of said PMOS differential circuit is inputted, a drain connected to a source of said first NMOS transistor, and a source connected to said second power supply terminal.

6. An output circuit for a semiconductor circuit having a PMOS differential circuit and an NMOS differential circuit, said output circuit comprising:

a plurality of transistors;

first and second reference voltage terminals connected to the transistors;

a first input terminal connected to a first differential output from the PMOS differential circuit and supplying a first input to the transistors;

a second input terminal connected to a second differential output from the NMOS differential circuit and supplying a second input to the transistors; and an output terminal connected to the transistors and supplying an output signal, wherein, in response to the first and second differential outputs, the transistors are arranged to (i) form a first current path between the first reference voltage terminal and the output terminal while blocking a second current path between the second reference voltage terminal and the output terminal or (ii) form the second current path between the second reference voltage terminal and the output terminal while blocking the first current path between the first reference voltage terminal and the output terminal, when inputs to the PMOS and NMOS differential circuits are at high and low levels, and to block both the first and second current paths, when the inputs to the PMOS and NMOS differential circuits are at an intermediate level.

7. An output circuit as claimed in claim 6, wherein the reference voltage terminals comprise a power supply terminal and a ground terminal.

8. An output circuit as claimed in claim 6, wherein said transistors include:

a first PMOS transistor having a control terminal to which the first differential output of said PMOS differential circuit is inputted, and a source connected to said first power supply terminal;

a second PMOS transistor having a control terminal to which the second differential output of said NMOS differential circuit is inputted, a source connected to a drain of said first PMOS transistor, and a drain connected to said output terminal;

a first NMOS transistor having a control terminal to which the first differential output of said PMOS differential circuit is inputted, and a drain connected to said output terminal and the drain of said second PMOS transistor; and a second NMOS transistor having a control terminal to which the second differential output of said NMOS differential circuit is inputted, a drain connected to a source of said first NMOS transistor, and a source connected to said second power supply terminal.

9. An output circuit as claimed in claim 6, wherein said transistors include:

a first PMOS transistor having a control terminal to which the second differential output of said NMOS differential circuit is inputted, and a source connected to said first power supply terminal;

a second PMOS transistor having a control terminal to which the first differential output of said PMOS differential circuit is inputted, a source connected to a drain of said first PMOS transistor, and a drain connected to said output terminal;

a first NMOS transistor having a control terminal to which the first differential output of said PMOS differential circuit is inputted, and a drain connected to said output terminal and the drain of said second PMOS transistor; and a second NMOS transistor having a control terminal to which the second differential output of said NMOS differential circuit is inputted, a drain connected to a source of said first NMOS transistor, and a source connected to said second power supply terminal.

10. An output circuit as claimed in claim 6, wherein said transistors include:

a first PMOS transistor having a control terminal to which the first differential output of said PMOS differential circuit is inputted, and a source connected to said first power supply terminal;

a second PMOS transistor having a control terminal to which the second differential output of said NMOS differential circuit is inputted, a source connected to a drain of said first PMOS transistor, and a drain connected to said output terminal;

a first NMOS transistor having a control terminal to which the second differential output of said NMOS differential circuit is inputted, and a drain connected to said output terminal and the drain of said second PMOS transistor; and a second NMOS transistor having a control terminal to which the first differential output of said PMOS differential circuit is inputted, a drain connected to a source of said first NMOS transistor, and a source connected to said second power supply terminal.

11. An output circuit as claimed in claim 6, wherein said transistors include:

a first PMOS transistor having a control terminal to which the second differential output of said NMOS differential circuit is inputted, and a source connected to said first power supply terminal;

a second PMOS transistor having a control terminal to which the first differential output of said PMOS differential circuit is inputted, a source connected to a drain of said first PMOS transistor, and a drain connected to said output terminal;

a first NMOS transistor having a control terminal to which the second differential output of said NMOS differential circuit is inputted, and a drain connected to said output terminal and the drain of said second PMOS transistor; and a second NMOS transistor having a control terminal to which the first differential output of said PMOS differential circuit is inputted, a drain connected to a source of said first NMOS transistor, and a source connected to said second power supply terminal.

* * * * *